(12) United States Patent
Numata et al.

(10) Patent No.: US 8,525,282 B2
(45) Date of Patent: Sep. 3, 2013

(54) SOLID-STATE IMAGING DEVICE

(75) Inventors: Aihiko Numata, Inagi (JP); Akinari Takagi, Yokosuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 170 days.

(21) Appl. No.: 12/893,016

(22) Filed: Sep. 29, 2010

(65) Prior Publication Data

US 2011/0079867 A1    Apr. 7, 2011

(30) Foreign Application Priority Data

Oct. 7, 2009   (JP) ................. 2009-233162

(51) Int. Cl.
*H01L 31/0232* (2006.01)

(52) U.S. Cl.
USPC ............ 257/432; 257/E31.127; 257/294

(58) Field of Classification Search
USPC ............ 257/E31.127, E31.119, E31.121
See application file for complete search history.

(56) References Cited

U.S. PATENT DOCUMENTS

| | | | | |
|---|---|---|---|---|
| 2005/0121599 A1* | 6/2005 | Mouli | ................. | 250/208.1 |
| 2007/0023799 A1* | 2/2007 | Boettiger | ................. | 257/292 |
| 2008/0170143 A1* | 7/2008 | Yoshida | ................. | 348/294 |
| 2010/0176280 A1* | 7/2010 | Yokogawa | ................. | 250/226 |
| 2010/0283086 A1* | 11/2010 | Lee et al. | ................. | 257/222 |

FOREIGN PATENT DOCUMENTS

| JP | 6-224398 A | 8/1994 |
|---|---|---|
| JP | 2002-118245 A | 4/2002 |

* cited by examiner

*Primary Examiner* — Matthew W Such
*Assistant Examiner* — Scott Stowe
(74) *Attorney, Agent, or Firm* — Fitzpatrick, Cella, Harper & Scinto

(57) ABSTRACT

A solid-state imaging device capable of making reduction in reflection at the interface between a light guide and an incident unit consistent with improvement in condensing efficiency by the light guide is provided. The solid-state imaging device includes a substrate internally including a photoelectric conversion unit, and a condensing unit provided on an optical incident side of the substrate. A configuration satisfying relationships of $|N1|<|\sqrt{\in}\times\sqrt{\mu}|$ and $0.63<N1/(\sqrt{\in}/\sqrt{\mu})<1.58$ on an end face of the optical incident side of the condensing unit is adopted. Here, N1 is a refractive index of a medium forming a region of the optical incident side of the condensing unit, and $\in$ is a specific permittivity of a medium forming the condensing unit, and $\mu$ is a specific permeability of the medium forming the condensing unit.

10 Claims, 11 Drawing Sheets

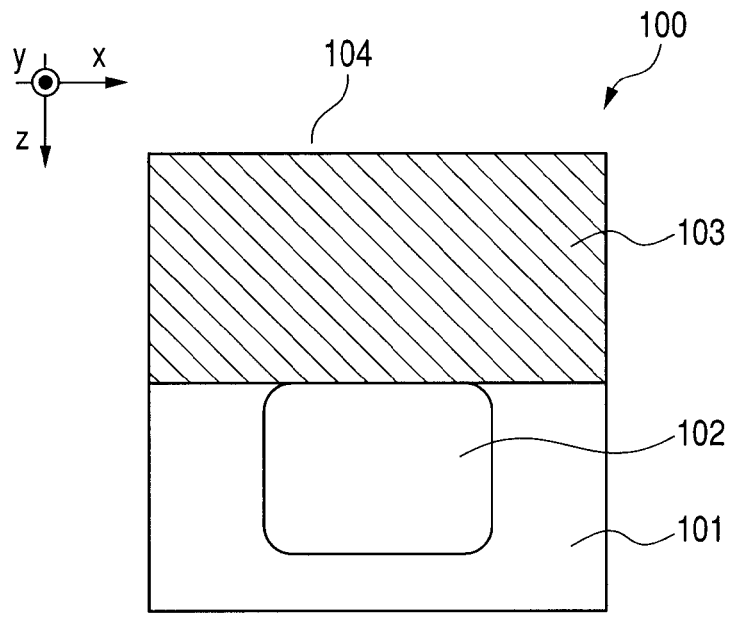
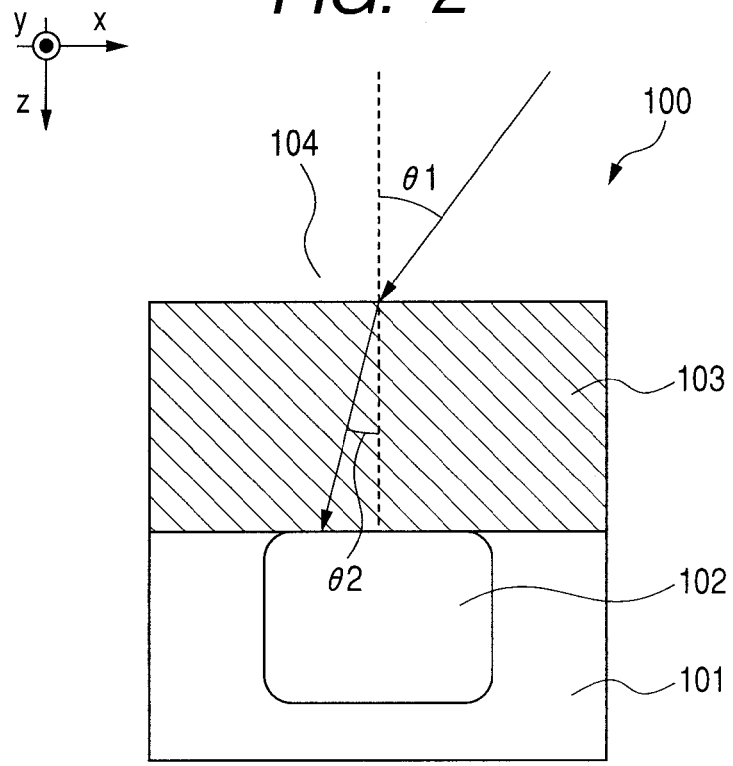

SOLID-STATE IMAGING DEVICE

BACKGROUND OF THE INVENTION

1. Field of the Invention

The present invention relates to a solid-state imaging device, and particularly to a solid-state imaging device used for a digital video camera and a digital still camera.

2. Description of the Related Art

In a solid-state imaging device used for a digital still camera or the like, there has been a tendency that the number of pixels is increased, while size of a pixel is reduced. Accordingly, the area of a photoelectric conversion unit is reduced, thereby reducing light receiving sensitivity. Further, the aspect ratio (depth/width) of a pixel structure is increased. The F-number of an on-chip lens is also increased. This reduces condensing efficiency, and light leaks to adjacent pixels, thereby causing crosstalk.

Conventionally, a solid-state imaging device including light guides as described in Japanese Patent Application Laid-Open No. H06-224398 has been proposed as a solution to these problems. The solid-state imaging device including the light guide according to the conventional art will hereinafter be described using a figure. FIG. 12 illustrates a schematic sectional view of a pixel unit of a solid-state imaging device of the conventional art. The solid-state imaging device of the conventional art includes a plurality of pixel units 200 arranged in a matrix manner. The pixel unit 200 includes a silicon substrate 201, a photoelectric conversion unit 202 disposed inside of the silicon substrate 201, and an inter-layer insulation unit 205 formed from transparent material on the silicon substrate 201. Wiring unit 206 is formed inside of the inter-layer insulation unit 205 at a predetermined position above the silicon substrate 201.

A high refractive index unit 203 is embedded inside of the inter-layer insulation unit 205 above each photoelectric conversion unit 202. The high refractive index unit 203 has a refractive index higher than that of the inter-layer insulation unit 205. The high refractive index unit 203 thereby configures a light guide. A taper unit is disposed above the light guide. The width of the taper unit gradually becomes wider toward the optical incident unit 204. Since the solid-state imaging device having such a configuration is adopted, light incident on the optical incident unit 204 is propagated while being concentrated in the high refractive index unit 203. As a result, the light is guided efficiently, while crosstalk is prevented from occurring above the silicon substrate 201.

SUMMARY OF THE INVENTION

The solid-state imaging device including the light guide according to the above-described conventional art has a following problem. That is, in the solid-state imaging device including the light guide according to the conventional art, the light guide includes the high refractive index unit, in order to efficiently guide the light incident on the optical incident unit to the photoelectric conversion unit, as described above. The angle of refraction should be small in order to efficiently guide even obliquely incident light to the photoelectric conversion unit by the light guide including the high refractive index unit. Accordingly, the refractive index of the high refractive index unit configuring the light guide should be high. However, if the refractive index of the high refractive index unit is high, reflection at the interface between the light guide and the incident unit is increased, and the condensing efficiency by the light guide is deteriorated.

In view of the above problem, it is an object of the present invention to provide a solid-state imaging device capable of making reduction in reflection at the interface between the light guide and the incident unit consistent with improvement in condensing efficiency by the light guide.

The present invention provides a solid-state imaging device configured as follows. The solid-states imaging device comprises a substrate internally including a photoelectric conversion unit, and a condensing unit provided on an optical incident side of the substrate, wherein, provided that a refractive index of a medium forming a region of the optical incident side of the condensing unit is N1, and a specific permittivity of a medium forming the condensing unit is $\in$, and a specific permeability of the medium forming the condensing unit is $\mu$, relationships of $|N1|<|\sqrt{\in}\times\sqrt{\mu}|$ and $0.63<N1/(\sqrt{\in}/\sqrt{\mu})<1.58$ are satisfied on an end face of the optical incident side of the condensing unit.

The present invention can realize a solid-state imaging device capable of making reduction in reflection at the interface between the light guide and the incident unit consistent with improvement in condensing efficiency by the light guide.

Further features of the present invention will become apparent from the following description of exemplary embodiments with reference to the attached drawings.

BRIEF DESCRIPTION OF THE DRAWINGS

FIG. 1 is a schematic sectional view of a pixel unit describing an example of a configuration of a solid-state imaging device according to an embodiment 1 of the present invention.

FIG. 2 is a diagram describing light propagation in the pixel unit of the embodiment 1 of the present invention.

DESCRIPTION OF THE EMBODIMENTS

Figure 3A:
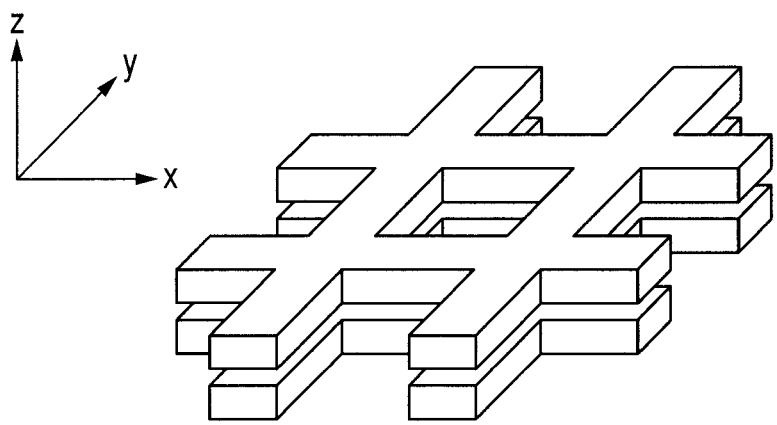
FIG. 3A is a diagram describing a structure for controlling specific permittivity and specific permeability in the pixel unit of the embodiment 1 of the present invention.

Preferred embodiments of the present invention will now be described in detail in accordance with the accompanying drawings.

Modes of the present invention will be described according to examples of configurations of solid-state imaging devices of following embodiments. In the entire diagrams for describing the embodiments, elements having the same functions are assigned with the same numerals. Redundant description thereof is omitted.

Embodiment 1

An example of a solid-state imaging device according to an embodiment 1 of the present invention will be described using FIG. 1. FIG. 1 illustrates a schematic sectional view of a pixel unit 100 of the solid-state imaging device. The solid-state imaging device includes a substrate internally containing a photoelectric conversion unit of this embodiment, and a condensing unit provided on an optical incident side of the substrate. Incident light from the optical incident side is guided through the condensing unit to the photoelectric conversion unit. The solid-state imaging device of this embodiment includes a plurality of pixel units 100 arranged in a matrix manner. The pixel unit 100 includes a silicon substrate 101 and a photoelectric conversion unit 102 arranged inside of the silicon substrate 101. In the pixel unit 100, a condensing unit 103 is formed above the silicon substrate 101. Hereinafter, a region above the condensing unit 103 is referred to as an optical incident unit 104.

It is provided that the refractive index of the optical incident unit 104 is N1, the specific permittivity of the condensing unit 103 is $\in$ and the specific permeability thereof is $\mu$. Here, if the following expression of condition is satisfied, a solid-state imaging device capable of improving the condensing efficiency while suppressing reflection can be obtained because of the following reason.

$$|N1| < |\sqrt{\in} \times \sqrt{\mu}| \text{ and } N1 = \sqrt{\in}/\sqrt{\mu}$$

Here, a condition for determining condensing efficiency will be described using FIG. 2, which describes propagation of light. As illustrated in FIG. 2, light incident on the optical incident unit 104 is refracted at the interface with the condensing unit 103. Provided that the angle of incidence is $\theta1$, the angle of refraction is $\theta2$, and the refractive index of the condensing unit 103 is N2, the following equation holds by the Snell's law.

$$\sin \theta2 = N1 \times \sin \theta1 / N2$$

The absolute value of the angle of refraction $\theta2$ should be small in order to efficiently guide the obliquely incident light to the photoelectric conversion unit 102. Accordingly, the greater the absolute value of N2 is than the absolute value of N1, the higher the condensing efficiency becomes.

Next, a condition for determining reflectivity will be described. The power reflectivity RBA of light incident from a region A to a region B is according to the following expression, provided that impedance values of the respective regions are ZA and ZB.

$$RBA = (ZA - ZB)^2 / (ZA + ZB)^2$$

Here, the impedance is the square root of a ratio of the specific permeability to the specific permittivity. More specifically, provided that the specific permittivity of the region A is $\in A$ and the specific permeability is $\mu A$, ZA is represented by the following expression.

$$ZA = \sqrt{\mu A}/\sqrt{\in A}$$

Provided that the ZB/ZA is ZBA, RBA is represented by the following expression.

$$RBA = (1 - ZBA)^2 / (1 + ZBA)^2$$

Accordingly, the closer to one the impedance ratio ZBA is the smaller the reflectivity becomes.

In a typical medium realized by the conventional art, the specific permeability is about one in frequency regions at microwave or higher. By substitution of this, the following expression is obtained.

$$ZBA = \sqrt{\in A}/\sqrt{\in B}.$$

Here, $NA = \sqrt{\mu A} \times \sqrt{\in A} = \sqrt{\in A}$ and $NB = \sqrt{\mu B} \times \sqrt{\in B} = \sqrt{\in B}$ for the refractive index NA of the region A and the refractive index NB of the region B. Using these relationships, the following expression is obtained.

$$ZBA = NA/NB$$

That is, in the conventional medium, the impedance ratio and the refractive index ratio of each region are equivalent. Accordingly, it is understood that the refractive index ratio is required to be close to one in order to reduce the reflectivity.

Figure 12:
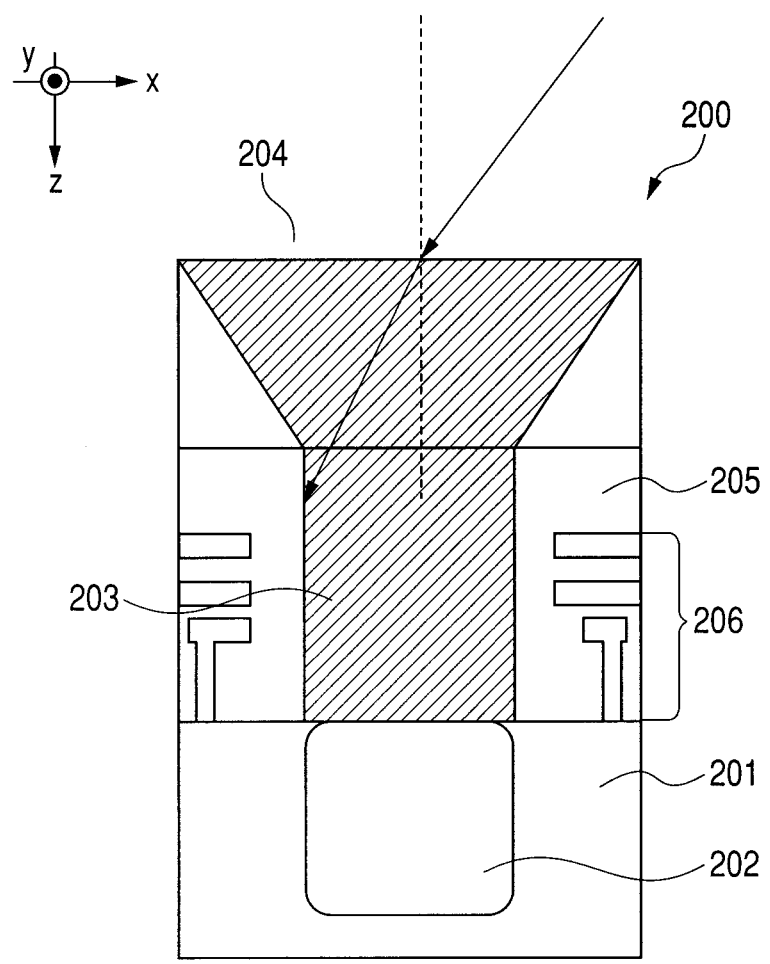
FIG. 12 is a diagram describing a solid-state imaging device according to a conventional art.

As described above, according to the configuration using the conventional medium as described in FIG. 12, it is required to make a ratio of the refractive index of the optical incident unit 204 to the refractive index of the high refractive index unit 203 close to one, in order to reducing the reflectivity between the optical incident unit 204 and the high refractive index unit 203. However, if the refractive index of the high refractive index unit 203 is increased more than the refractive index of the optical incident unit 204 in order to improve the condensing efficiency, the refractive index ratio moves away from one. Accordingly, in a case of using the conventional medium, it is difficult to reduce reflectivity while improving the condensing efficiency. On the other hand, the configuration of this embodiment adopts the medium where specific permeability $\mu$ of the condensing unit 103 is not one. As described above, in order to increase the condensing efficiency, the absolute value of the refractive index $N2=\sqrt{\in}\times\sqrt{\mu}$ may be specified larger than the absolute value of N1. On the other hand, in order to reduce the reflectivity, the impedance $\sqrt{\mu}/\sqrt{\in}$ and $1/N1$ may be specified close to each other. That is, if the conditions $|N1|<|\sqrt{\in}\times\sqrt{\mu}|$ and $N1=\sqrt{\in}/\sqrt{\mu}$ are satisfied, the solid-state imaging device capable of reducing reflection while improving the condensing efficiency can be obtained. These conditions are different from the conditions in the case of using the conventional medium, and can be made consistent with each other. For example, it is provided that N1=1 (optical incident unit is air), $\in=-10$, and $\mu=-10$. Accordingly, $|\sqrt{\in}\times\sqrt{\mu}|=10$ and $\mu\in/\sqrt{\mu}=1$, thereby satisfying $|N1|<|\sqrt{\in}\times\sqrt{\mu}|$ and $N1=\sqrt{\in}/\sqrt{\mu}$.

It is not necessary that, in the above expressions of condition $|N1|<|\sqrt{\in}\times\sqrt{\mu}|$ and $N1=\sqrt{\in}/\sqrt{\mu}$, $N1=\sqrt{\in}/\sqrt{\mu}$ strictly holds. Provided that the ratio between N1 and $\mu\in/\sqrt{\mu}$, which is $(N1/(\sqrt{\in}/\sqrt{\mu}))$, is Z, if it is desired to suppress the reflectivity within 5%, the following relationship (Expression 1) may be satisfied, at least at the end face of the optical incident side of the condensing unit.

$$|N1|<|\sqrt{\in}\times\sqrt{\mu}| \text{ and } 0.63<Z<1.58 \quad \text{(Expression 1)}$$

If it is desired to suppress the reflectivity within 1%, the following relationship (Expression 2) may be satisfied, at least at the end face of the optical incident side of the condensing unit.

$$|N1|<|\sqrt{\in}\times\sqrt{\mu}| \text{ and } 0.82<Z<1.22 \quad \text{(Expression 2)}$$

In the conventional configuration, SiN with refractive index of two is often used as a material for the high refractive index unit 203. In this case, the reflectivity is about 11%. According to comparison of the values of reflectivity, it is understood that simultaneous control of the specific permittivity and the specific permeability of the condensing unit 103 make improvement in condensing efficiency and reduction in reflection consistent with each other.

Figure 3B:
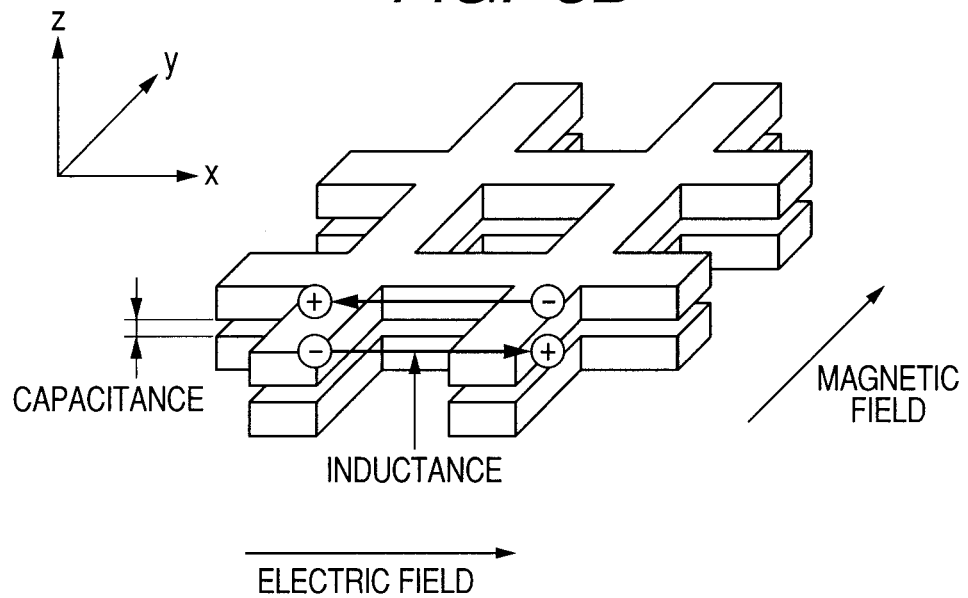
FIG. 3B is a diagram describing a structure for controlling specific permittivity and specific permeability in the pixel unit of the embodiment 1 of the present invention.
Figure 4A:
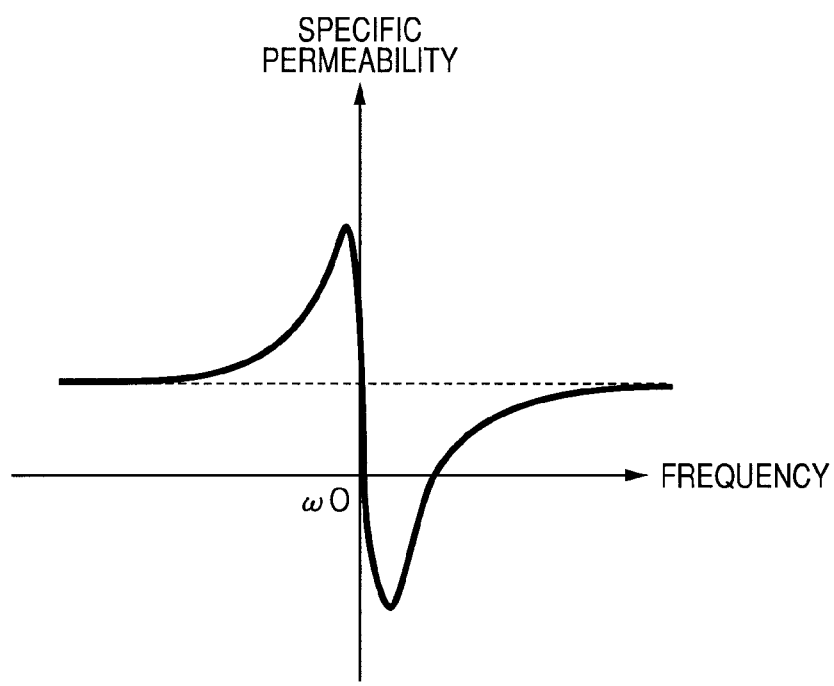
FIG. 4A is a diagram describing frequency dependence of the specific permeability in the pixel unit of the embodiment 1 of the present invention.

A specific configuration of a material having a specific permeability which cannot be found in the conventional media and which is used for the condensing unit 103 will be described with reference to FIGS. 3A and 3B. FIG. 3A is a diagram describing a configuration of a material used for the condensing unit 103. This structure is referred to as a fishnet structure. In this structure, a pair of metallic rods, which are separated in z direction by a dielectric and extend in x direction, are connected by metallic rods extending in y direction. Control of specific permeability using the fishnet structure will herein be described. It is provided that light having the vibration direction of the electric field in x direction and the vibration direction of the magnetic field in y direction is incident on the fishnet structure from −z direction. Here, electric currents flow in +x direction and −x direction are induced in the two metallic rods extending in x direction. That is, the two metallic rods function as inductances. However, since the metallic rods are separated by the dielectric, charges are accumulated here. That is, a region sandwiched by the metallic rods functions as a capacitor. The inductance and the capacitor form an LC resonator. Accordingly, magnetic dipole resonance is caused in a specific frequency (FIG. 3B). FIG. 4A illustrates frequency dependence of the specific permeability of the fishnet structure. $\omega 0$ is a resonant frequency of the magnetic dipole resonance. This diagram represents Lorentz variance where the specific permeability is sharp around $\omega 0$. $\omega 0$ and Q value of the resonator defining the sharpness of the variance are determined by the shape of the fishnet structure. Accordingly, if the shape of the resonator is appropriately set, a material with any specific permeability is realized. For example, if the dimension of the fishnet structure is specified to be about 50-500 nm, a resonator where $\omega 0$ is in the visible light band can be realized.

Figure 4B:
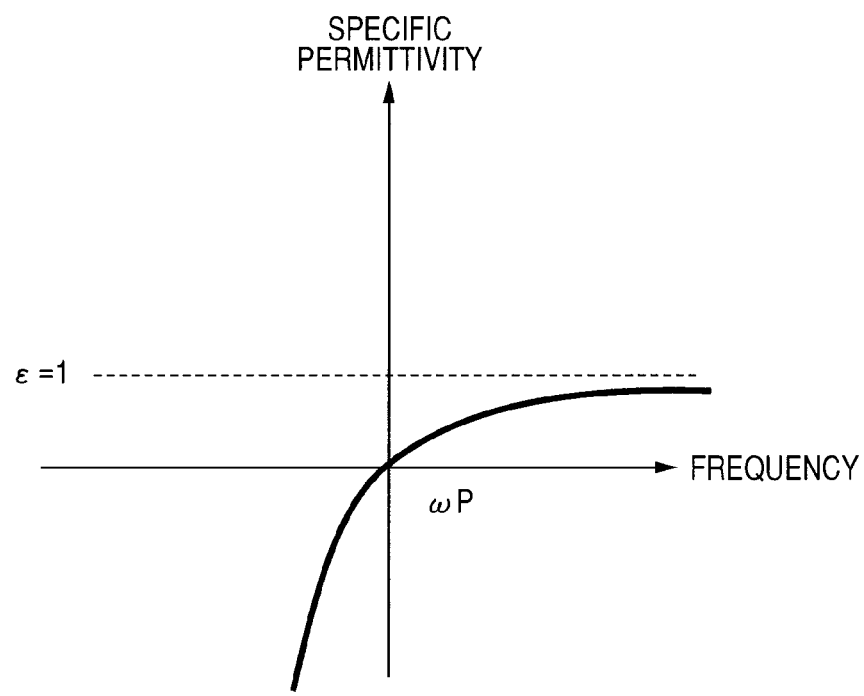
FIG. 4B is a diagram describing frequency dependence of the specific permittivity in the pixel unit of the embodiment 1 of the present invention.

Next, control of the specific permittivity using the fishnet structure will be described. It is provided that light having the vibration direction of the electric field in x direction and the vibration direction of the magnetic field in y direction is incident on the fishnet structure from −z direction. Here, the electric field polarizes free electrons in the metal. In particular, since the longitudinal direction of the metallic rod (x direction) and the vibration direction of the electric field (x direction) coincide with each other, strong polarization occurs. The polarization of free electrons is generally described by the Drude model. The specific permittivity has frequency dependence as illustrated in FIG. 4B. Because the plasma frequencies $\omega P$ of gold and silver are in an ultraviolet region, the specific permittivity has a negative value in the visible light band. For example, it is herein provided that the absolute value of the specific permittivity of the metallic rod is a value of $|\in FN|$, which is sufficiently larger than $N1^2$ in a wavelength band to be used. Here, if the shape of the fishnet structure is appropriately controlled and the specific permeability $\mu FN$ of the fishnet structure in the wavelength band to be used is specified to be $\mu FN=\in FN/N1^2$, the following expressions can hold in a manner consistent with each other.

$$|\sqrt{\in FN}\times\sqrt{\mu FN}|>|N1| \text{ and } \sqrt{\in FN}/\sqrt{\mu FN}=N1$$

Figure 5A:
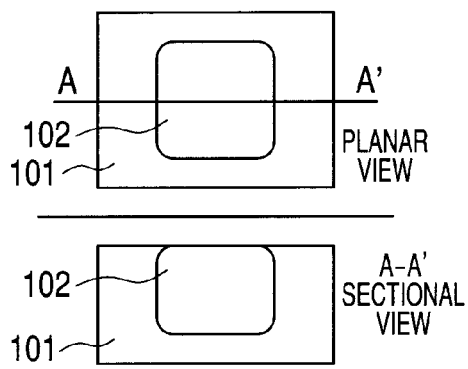
FIG. 5A is a diagram describing a method of manufacturing the solid-state imaging device according to the embodiment 1 of the present invention.
Figure 5C:
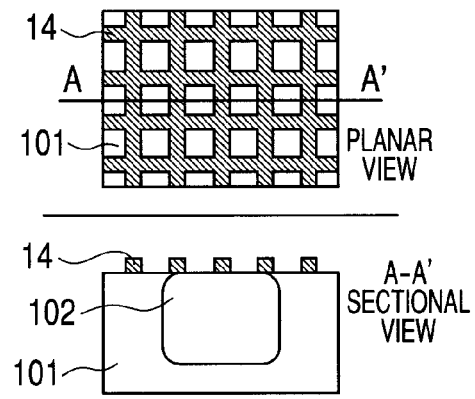
FIG. 5C is a diagram describing a method of manufacturing the solid-state imaging device according to the embodiment 1 of the present invention.
Figure 5B:
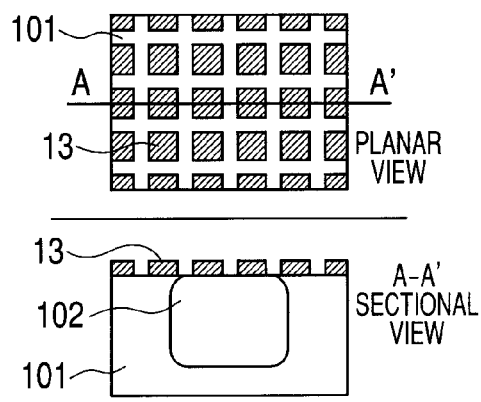
FIG. 5B is a diagram describing a method of manufacturing the solid-state imaging device according to the embodiment 1 of the present invention.
Figure 5D:
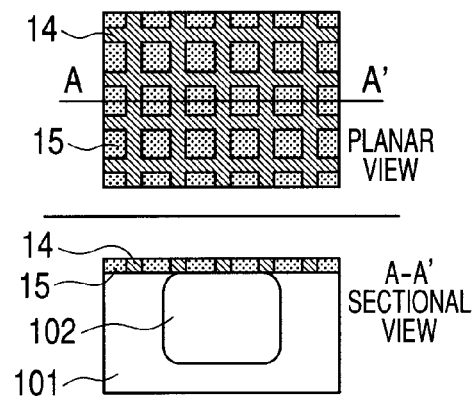
FIG. 5D is a diagram describing a method of manufacturing the solid-state imaging device according to the embodiment 1 of the present invention.
Figure 5E:
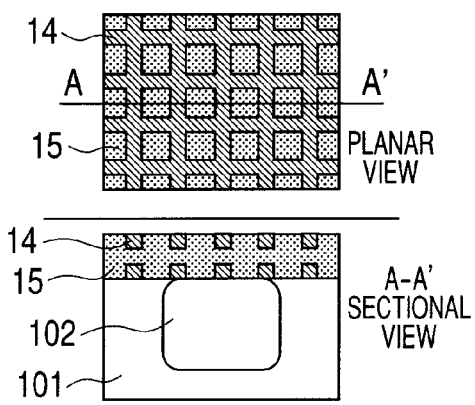
FIG. 5E is a diagram describing a method of manufacturing the solid-state imaging device according to the embodiment 1 of the present invention.

Next, a method of manufacturing the solid-state imaging device according to this embodiment will be described using FIGS. 5A to 5E. First, the photoelectric conversion unit 102 is formed in a prescribed position in the silicon substrate 101 (FIG. 5A). Subsequently, a resist 13 such as AR-N is applied on the silicon substrate 101. A negative pattern in planar view for a first layer of the fishnet structure is made by EB drawing and development (FIG. 5B). Next, metal 14 such as gold is deposited on a part without the resist 13 by an EB vapor deposition method. Subsequently, the resist 13 is lifted off, and the first layer of the fishnet can be made (FIG. 5C). Next, a part other than the fishnet structure is filled with resin 15 such as PC403, and flattened by CMP or the like (FIG. 5D). Subsequently, processes of FIGS. 5A to 5C are repeated, and a second layer of the fishnet is made (FIG. 5E). In a case of stacking a plurality of fishnet structures, the above processes may be repeated. In this embodiment, the fishnet structure is adopted as the material of the condensing unit 103. However, the configuration is not limited to the fishnet structure. Instead, any configuration capable of realizing a desired specific permittivity and a specific permeability may be adopted.

Figure 6A:
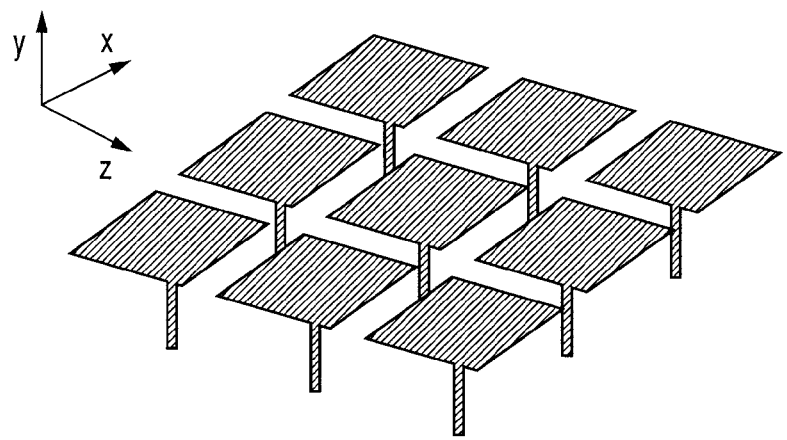
FIG. 6A is a diagram describing another example of a structure for controlling the specific permittivity and the specific permeability in the pixel unit of the embodiment 1 of the present invention.
Figure 6B:
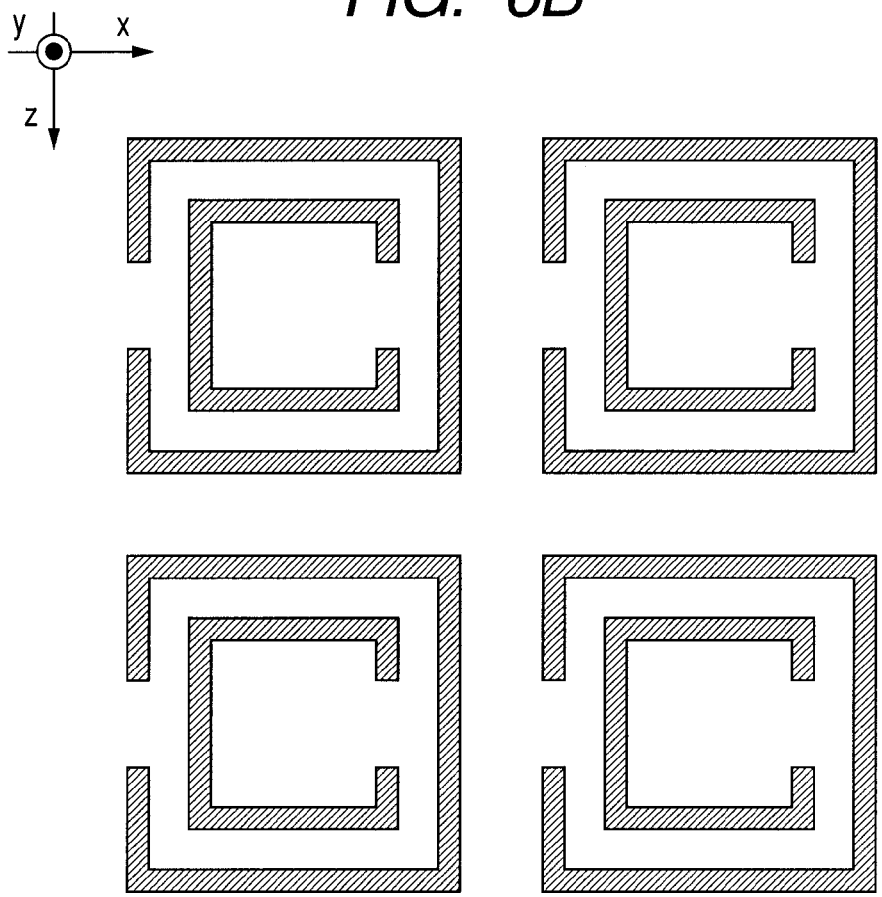
FIG. 6B is a diagram describing another example of a structure for controlling the specific permittivity and the specific permeability in the pixel unit of the embodiment 1 of the present invention.

It is known that another structure can cause magnetic dipole resonance. Likewise, for example, a mushroom structure illustrated in FIG. 6A where metallic rods support metallic plates separated from each other, and a split-ring resonator structure illustrated in FIG. 6B including double metallic coils having openings can cause the magnetic dipole resonance, and may be adopted therefore. As illustrated in FIG.

Figure 7A:
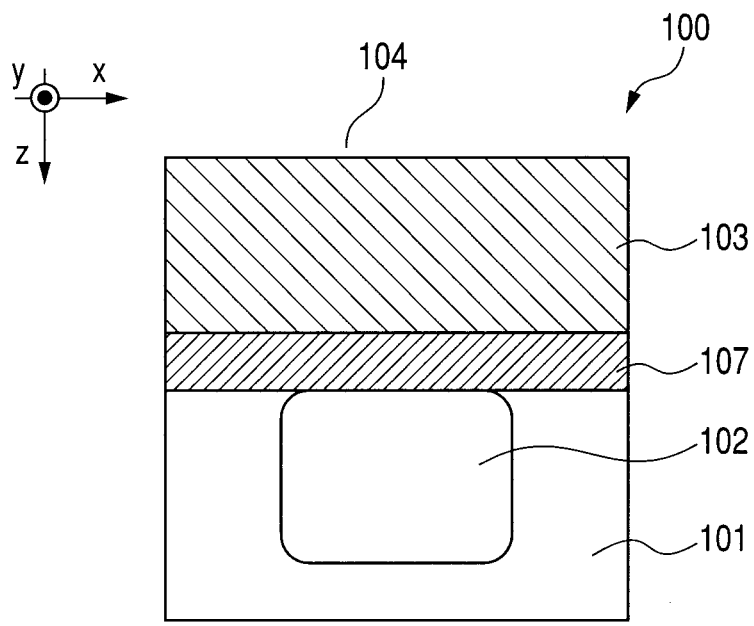
FIG. 7A is a diagram describing an example of a configuration further including an antireflection unit between the condensing unit and the photoelectric conversion unit in the pixel unit of the embodiment 1 of the present invention.
Figure 7B:
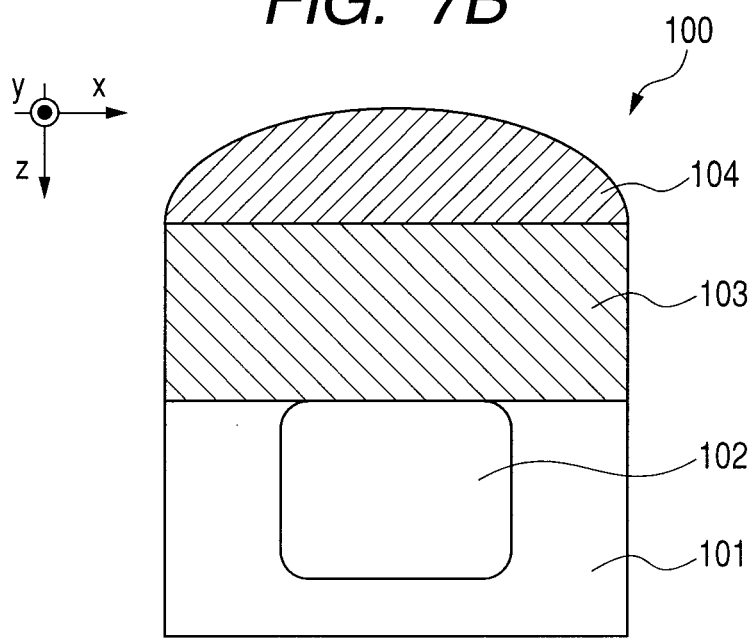
FIG. 7B is a diagram describing an example of a structure further including a micro-lens at an optical incident side of a condensing unit.

7A, an antireflection unit 107 may further be provided between the condensing unit 103 and the photoelectric conversion unit 102. Since the antireflection unit 107 is provided, reflection between the condensing unit 103 and the photoelectric conversion unit 102 can be reduced. Accordingly, the solid-state imaging device with smaller reflectivity can be realized. A dielectric film whose optical thickness in the frequency band to be used is one-fourth of the wavelength may be used as the antireflection unit 107. As illustrated in FIG. 7B, a micro-lens may further be provided on the optical incident side of the condensing unit 103. Since the micro-lens is provided, the angle of incidence θ1 of the light incident on the condensing unit 103 is reduced. Accordingly, the angle of refraction θ2 can further be reduced. As a result, the solid-state imaging device having higher condensing efficiency can be realized. In this case, the optical incident unit 104 corresponds to the micro-lens. Accordingly, provided that the refractive index of the medium configuring the micro-lens is N1, the specific permittivity ∈ and the specific permeability μ of the condensing unit 103 may be determined so as to satisfy the following expressions.

$$|N1|<|\sqrt{\in}\times\sqrt{\mu}| \text{ and } N1=\sqrt{\in}/\sqrt{\mu}$$

Embodiment 2

Figure 8A:
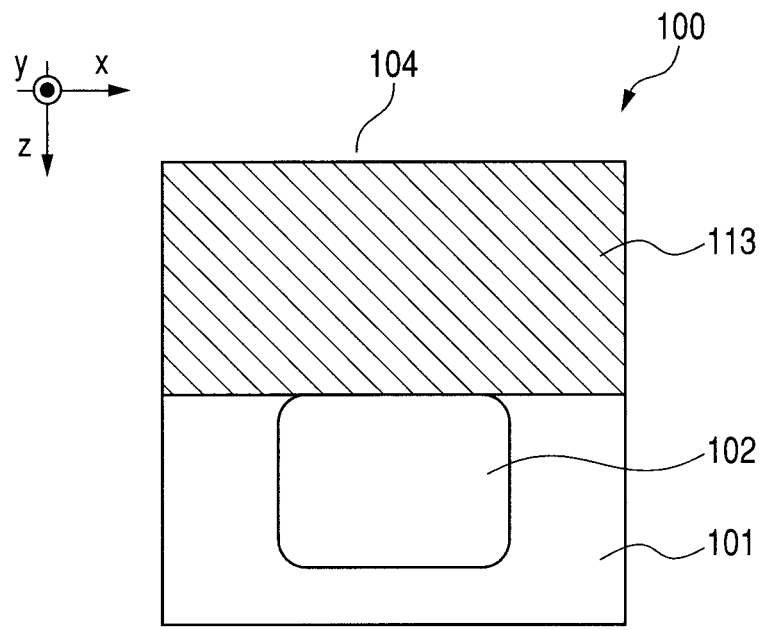
FIG. 8A is a schematic sectional view of a pixel unit describing an example of a configuration of a solid-state imaging device according to an embodiment 2 of the present invention.
Figure 8B:
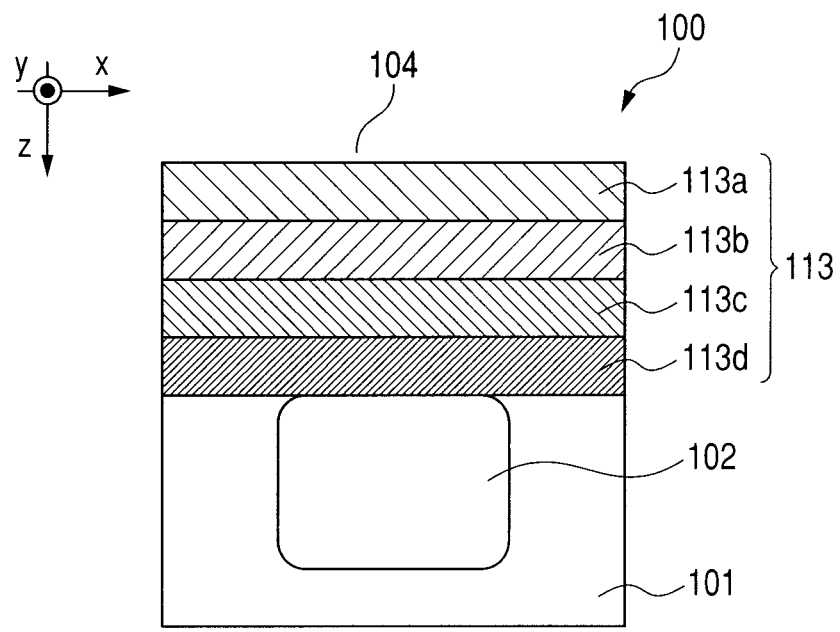
FIG. 8B is a schematic sectional view of a pixel unit describing an example of a configuration of a solid-state imaging device according to an embodiment 2 of the present invention.

A solid-state imaging device according to an embodiment 2 will be described using FIGS. 8A and 8B. This embodiment is different from the embodiment 1 in the following configuration. That is, in this embodiment, the specific permittivity ∈ and the specific permeability μ of the condensing unit 113 satisfy the expression of condition, $|N1|<|\sqrt{\in}\times\sqrt{\mu}|$, and the value of $\sqrt{\in}/\sqrt{\mu}$ is changed from the optical incident side toward the photoelectric conversion unit. Provided that the refractive index of the photoelectric conversion unit 102 is N3, the value of $\sqrt{\in}/\sqrt{\mu}$ is changed so as to hold $\sqrt{\in}/\sqrt{\mu}=N1$ at the optical incident side and $\sqrt{\in}/\sqrt{\mu}=N3$ at the photoelectric conversion unit side.

As described above, the smaller the reflectivity on the boundary interface is, the closer to one the impedance ratio between two media contact with each other at the boundary becomes. Accordingly, if $\sqrt{\in}/\sqrt{\mu}=N3$ holds, the reflection between the condensing unit 113 and the photoelectric conversion unit 102 can be suppressed. Further, the absolute value $|\sqrt{\in}\times\sqrt{\mu}|$ of the refractive index of the condensing unit 113 has a value higher than the absolute value $|N1|$ of the refractive index of the optical incident unit 104. Accordingly, the absolute value of the angle of refraction of the light propagated through the condensing unit 113 remains small, and thereby allowing high condensing efficiency to be obtained.

This condition can be realized by controlling ∈ and μ of the condensing unit 113. For example, analogous to the embodiment 1, it is provided that N1=1, and ∈=−10 and μ=−10 on the optical incident side, the medium of the photoelectric conversion unit 102 is silicon, and N3=4. Here, if ∈=−80 and μ=−0.625 on the photoelectric conversion unit side of the condensing unit 113, $\sqrt{\in}/\sqrt{\mu}=4$ and thereby agrees with N3. Here, $|\sqrt{\in}\times\sqrt{\mu}|=10>|N1|$ is held.

Analogous to the embodiment 1, in a case of using the fishnet structure for the condensing unit 113, the specific permeability μ and the specific permittivity ∈ can be controlled by controlling the shape of the fishnet structure. For example, if the thickness of the dielectric is reduced in z direction, the resonant frequency of the magnetic resonator is increased and the specific permeability is changed. If the length of the metallic rod extending in x direction is increased, the polarization in x direction is increased and the specific permittivity is increased. Accordingly, if the shape of the fishnet structure is gradually changed from the optical incident side toward the photoelectric conversion unit side, the condensing unit where the value of $\sqrt{\in}/\sqrt{\mu}$ is changed from the optical incident side toward the photoelectric conversion unit side while holding the condition $|\sqrt{\in}\times\sqrt{\mu}|>|N1|$ can be realized.

In this embodiment, $|\sqrt{\in}\times\sqrt{\mu}|$ is changed so as to be certain values at the optical incident unit side and the photoelectric conversion unit side. However, only if the value is larger than the absolute value of N1, the value is not required to be the certain values. In order to increase the condensing efficiency, $|\sqrt{\in}\times\sqrt{\mu}|$ can remain a large value in the condensing unit.

$\sqrt{\in}/\sqrt{\mu}=N3$ is not necessarily hold. Only if $\sqrt{\in}/\sqrt{\mu}$ of the photoelectric conversion unit side is closer to N3 than $\sqrt{\in}/\sqrt{\mu}$ of the optical incident side, the reflectivity between the condensing unit 113 and the photoelectric conversion unit 102 can be reduced. Note that the closer the value $\sqrt{\in}/\sqrt{\mu}$ of the photoelectric conversion unit side and the value N3 become to each other, the more the reflectivity can be reduced. The value $\sqrt{\in}/\sqrt{\mu}$ in the condensing unit 113 may continuously be changed, as illustrated in FIG. 8A. Instead, the condensing unit 113 may include the layered structure of different layers 113a to 113d of the value $\sqrt{\in}/\sqrt{\mu}$ and stepwisely be changed, as illustrated in FIG. 8B.

Embodiment 3

Figure 9A:
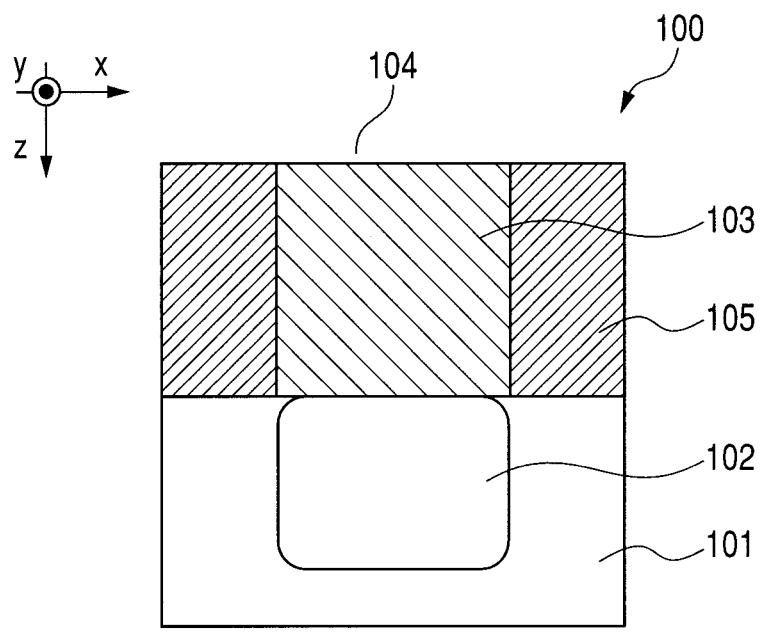
FIG. 9A is a schematic sectional view of a pixel unit describing an example of a configuration of a solid-state imaging device according to an embodiment 3 of the present invention.
Figure 9B:
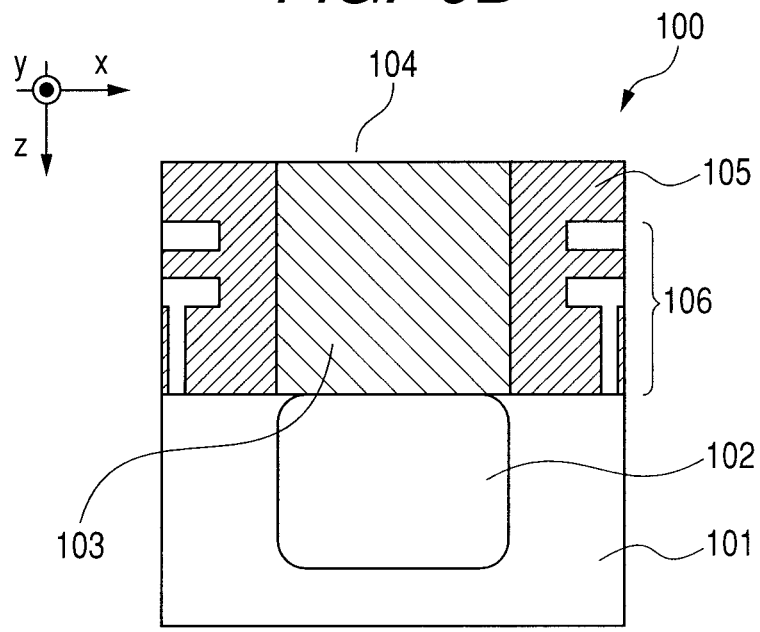
FIG. 9B is a schematic sectional view of a pixel unit describing an example of a configuration of a solid-state imaging device according to an embodiment 3 of the present invention.

An example of a configuration of a solid-state imaging device according to an embodiment 3 will be described using FIGS. 9A and 9B. This embodiment is different from the embodiment 1 in the following configuration. That is, this embodiment includes a structure where a barrier unit 105 is arranged around the condensing unit 103, as illustrated in FIG. 9A. Further, provided that the specific permittivity of the barrier unit 105 is ∈2 and the specific permeability is μ2, the barrier unit 105 is configured so as to satisfy the following relationship (Expression 3).

$$|\sqrt{\in 2}\times\sqrt{\mu 2}|<|\sqrt{\in}\times\sqrt{\mu}| \quad \text{(Expression 3)}$$

If the absolute value $|\sqrt{\in}\times\sqrt{\mu}|$ of the refractive index of the condensing unit 103 is larger than the absolute value $|\sqrt{\in 2}\times\sqrt{\mu 2}|$ of the refractive index of the barrier unit 105, the light incident from the optical incident unit 104 can be condensed in the condensing unit 103 and guided to the photoelectric conversion unit 102. Accordingly, light leaking to adjacent pixels can be reduced. As illustrated in FIG. 9B, if the wiring unit 106 is provided in the barrier unit 105, there is a problem that light is scattered by the wiring unit 106 and leaks to the adjacent pixels in the conventional configuration. However, the configuration illustrated in this embodiment, light is condensed in the condensing unit 103. Accordingly, scattering of light owing to the wiring unit 106 can be reduced.

The barrier unit 105 may be made of a material satisfying the relationship $|\sqrt{\in 2}\times\sqrt{\mu 2}|<|\sqrt{\in}\times\sqrt{\mu}|$, and the value $|\sqrt{\in 2}\times\sqrt{\mu 2}|$ can be as small as possible. This is because the higher the absolute value of the refractive index of the condensing unit 103 is than the absolute value of the refractive index of the barrier unit 105, the further the light is condensed in the condensing unit 103, improving the condensing efficiency. In particular, the specific permittivity ∈2 and the specific permeability μ2 of the barrier unit 105 can satisfy the following relationship (Expression 4), because the condensing efficiency can further be improved.

$$|\sqrt{\in 2}\times\sqrt{\mu 2}|<1 \quad \text{(Expression 4)}$$

Figure 10A:
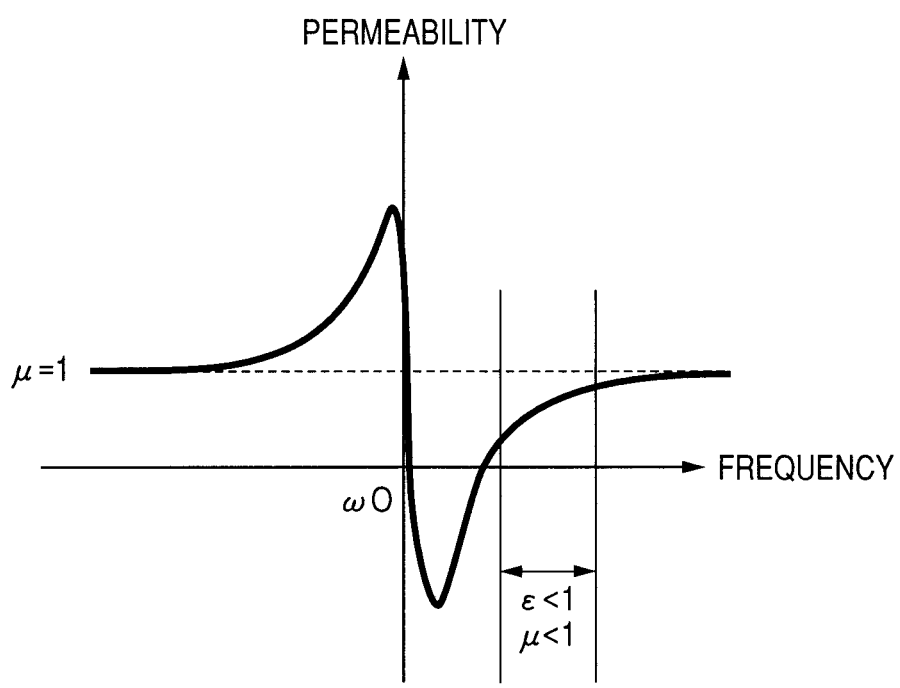
FIG. 10A is a diagram describing a frequency band of the specific permeability used for the pixel unit of the embodiment 3 of the present invention.
Figure 10B:
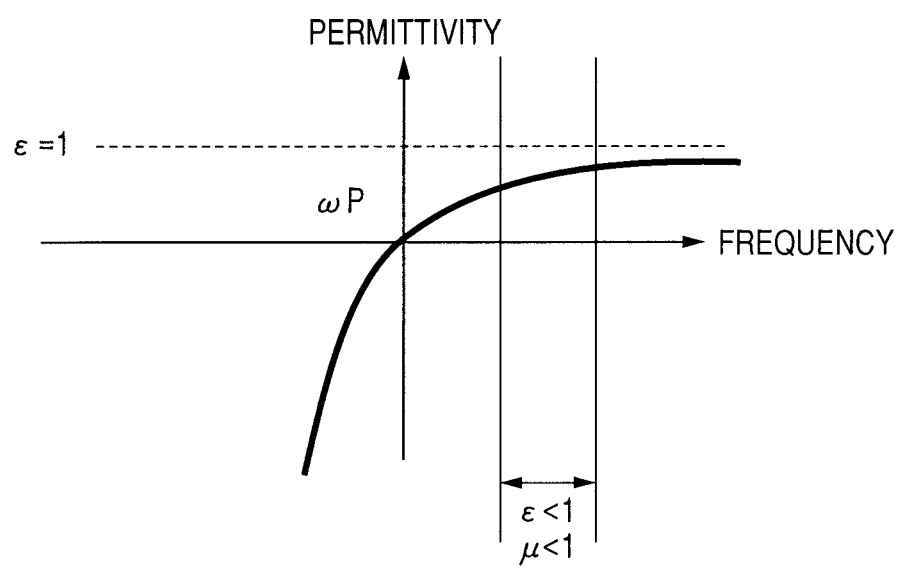
FIG. 10B is a diagram describing a frequency band of the specific permittivity used for the pixel unit of the embodiment 3 of the present invention.
Figure 11A:
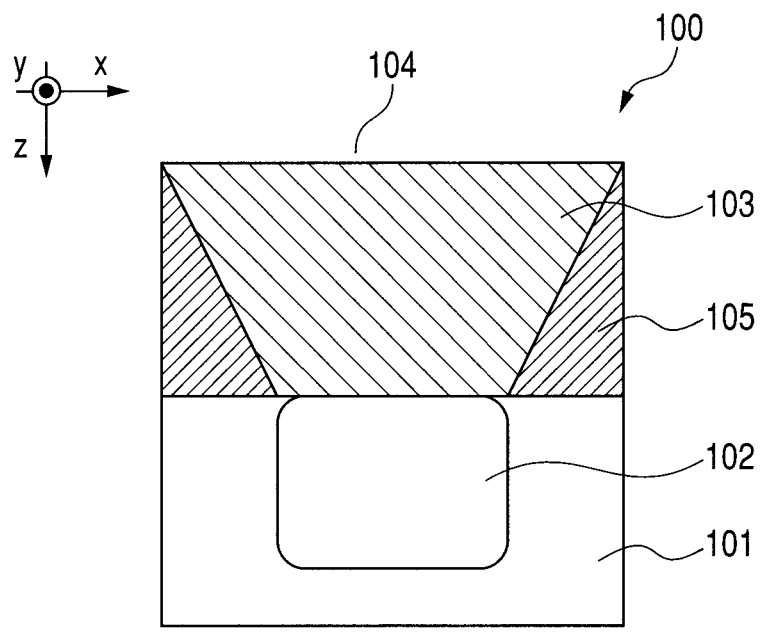
FIG. 11A is a diagram describing an example of a configuration where the width of a condensing unit in the pixel unit of the embodiment 3 of the present invention is continuously changed.
Figure 11B:
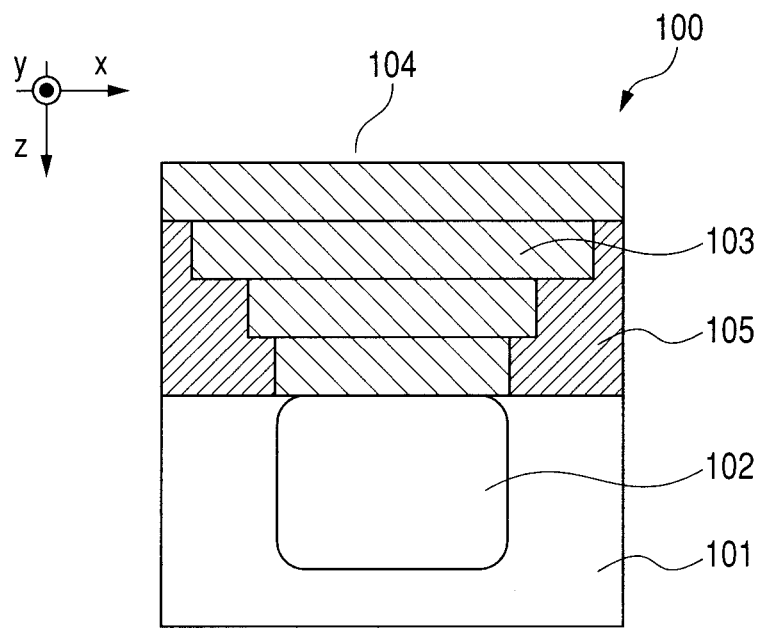
FIG. 11B is a diagram describing an example of a configuration where the width of a condensing unit is stepwisely changed.

Here, there is no typical medium satisfying $|\sqrt{\in 2}\times\sqrt{\mu 2}|<1$. Accordingly, the fishnet structure is used also for the barrier unit 105, as with the condensing unit 103. More specifically, the regions of permittivity and permeability illustrated in FIGS. 10A and 10B may be used. Since the fishnet structure is used for the barrier unit 105, the condensing efficiency can further be improved in comparison with a case of using the conventional medium. If $|\sqrt{\epsilon 2}\times\sqrt{\mu 2}|=0$ can be realized, light is completely blocked from the barrier unit 105. As illustrated in FIGS. 11A and 11B, the width of the condensing unit 103 can be narrowed from the entire width of the optical incident side toward the width of the photoelectric conversion unit 102. Here, the light incident on the entire region of the optical incident unit 104 can be condensed so as to conform to the width of the photoelectric conversion unit 102. The width of the condensing unit 103 may continuously be changed, as illustrated in FIG. 11A. Instead, the width may stepwisely be changed as illustrated in FIG. 11B.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-233162, filed Oct. 7, 2009, which is hereby incorporated by reference herein in its entirety.

What is claimed is:

1. A solid-state imaging device, comprising:
   a substrate internally including a photoelectric conversion unit; and
   a condensing unit, having a structure giving rise to magnetic resonance, provided on an optical incident side of the substrate,
   wherein, the structure includes a plurality of metal structures separated in a direction perpendicular to a surface of the substrate, each of the metal structures has a one-dimensionally-extended structure in a direction parallel to the surface of the substrate, each of longitudinal directions of the one-dimensionally-extended structures extends in a same direction, and the one-dimensionally-extended structures are mutually covered along the longitudinal directions thereof, provided that a refractive index of a medium being a region of the optical incident side of the condensing unit is N1,
   a specific permittivity of a medium forming the condensing unit is $\epsilon$, and
   a specific permeability of the medium forming the condensing unit, controlled based on the structure, is $\mu$,
   relationships of $|N1|<|\sqrt{\epsilon}\times\sqrt{\mu}|$ and $0.63<N1/(\sqrt{\epsilon}/\sqrt{\mu})<1.58$ are satisfied on an end face of the optical incident side of the condensing unit.

2. The solid-state imaging device according to claim 1, wherein $0.82<N1/(\sqrt{\epsilon}/\sqrt{\mu})<1.22$.

3. The solid-state imaging device according to claim 1, further comprising an antireflection unit provided between the photoelectric conversion unit and the condensing unit.

4. The solid-state imaging device according to claim 1, wherein a value of $\sqrt{\epsilon}/\sqrt{\mu}$ is continuously or stepwisely changed from the optical incident side toward a photoelectric conversion unit side of the condensing unit.

5. The solid-state imaging device according to claim 1, further comprising a micro-lens provided on the optical incident side of the condensing unit.

6. The solid-state imaging device according to claim 1, wherein each of $\epsilon$ and $\mu$ has a value which is same sign.

7. The solid-state imaging device according to claim 1, wherein each of $\epsilon$ and $\mu$ has a negative value.

8. The solid-state imaging device according to claim 1, further comprising a barrier unit arranged around the condensing unit, wherein, provided that a specific permittivity of the barrier unit is $\epsilon 2$, and a specific permeability of the barrier unit is $\mu 2$, a relationship of $|\sqrt{\epsilon 2}\times\sqrt{\mu 2}|<|\sqrt{\epsilon}\times\sqrt{\mu}|$ is satisfied.

9. The solid-state imaging device according to claim 8, wherein the specific permittivity $\epsilon 2$ and the specific permeability $\mu 2$ of the barrier unit satisfy a relationship of $|\sqrt{\epsilon 2}\times\sqrt{\mu 2}|<1$.

10. The solid-state imaging device according to claim 8, wherein a width of the condensing unit is continuously or stepwisely changed from the optical incident side toward a photoelectric conversion unit side.

* * * * *